(12) United States Patent
Sun

(10) Patent No.: US 11,527,559 B2
(45) Date of Patent: Dec. 13, 2022

(54) FLEXIBLE DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Xiaoqian Sun, Hubei (CN)

(73) Assignee: WUHAN CHINA STAR OPTOELECTRONICS SEMICONDUCTOR DISPLAY TECHNOLOGY CO., LTD, Hubei (CN)

( * ) Notice: Subject to any disclaimer, the term of this patent is extended or adjusted under 35 U.S.C. 154(b) by 168 days.

(21) Appl. No.: 16/755,890

(22) PCT Filed: Mar. 24, 2020

(86) PCT No.: PCT/CN2020/080962
§ 371 (c)(1),
(2) Date: Apr. 14, 2020

(87) PCT Pub. No.: WO2021/159589
PCT Pub. Date: Aug. 19, 2021

(65) Prior Publication Data
US 2021/0408086 A1 Dec. 30, 2021

(30) Foreign Application Priority Data
Feb. 10, 2020 (CN) .......................... 202010084049.5

(51) Int. Cl.
*H01L 27/12* (2006.01)
*H01L 27/32* (2006.01)

(52) U.S. Cl.
CPC ...... *H01L 27/1262* (2013.01); *H01L 27/1218* (2013.01); *H01L 27/1248* (2013.01); *H01L 27/32* (2013.01)

(58) Field of Classification Search
CPC ............. H01L 27/1262; H01L 27/1218; H01L 27/1248; H01L 2251/566; H01L 27/32; G02F 1/133305; G09F 9/301
See application file for complete search history.

(56) References Cited

U.S. PATENT DOCUMENTS 10,672,304 B2 * 6/2020 Choi ........................ G09F 9/301
11,087,647 B2 * 8/2021 Yang ..................... G06F 1/1652
(Continued)

FOREIGN PATENT DOCUMENTS

CN 108428728 A 8/2018
CN 108807480 A 11/2018
(Continued)

*Primary Examiner* — Mohsen Ahmadi
(74) *Attorney, Agent, or Firm* — Soroker Agmon Nordman

(57) ABSTRACT

A flexible display panel and a manufacturing method thereof are provided. The flexible display panel includes a display region and a non-display region. A part of the flexible display panel disposed in the non-display region includes a flexible substrate, a multi-barrier layer, and a planarization layer. A cutting track is defined at a peripheral edge of the non-display region, and a groove is defined in the cutting track. An end of the planarization layer extends to at least an interface formed between the multi-barrier layer and the flexible substrate through a sidewall of the groove.

9 Claims, 3 Drawing Sheets

(56) References Cited

U.S. PATENT DOCUMENTS

| | | | |
|---|---|---|---|
| 11,114,627 B2 * | 9/2021 | Yu | H01L 51/0097 |
| 11,158,687 B2 * | 10/2021 | Choi | H01L 51/5253 |
| 11,316,137 B2 * | 4/2022 | Sun | H01L 51/56 |
| 11,329,070 B2 * | 5/2022 | Park | H01L 27/124 |
| 11,329,255 B2 * | 5/2022 | Lim | H01L 27/3276 |
| 11,335,867 B2 * | 5/2022 | Jung | H01L 51/5237 |
| 11,348,985 B2 * | 5/2022 | Seon | H01L 27/3246 |
| 2007/0273271 A1 | 11/2007 | Yamazaki | |
| 2015/0048329 A1 | 2/2015 | Kim | |
| 2018/0090698 A1 * | 3/2018 | Jeong | H01L 51/0097 |
| 2018/0183015 A1 * | 6/2018 | Yun | H01L 51/0097 |
| 2019/0348489 A1 * | 11/2019 | Na | H01L 27/124 |
| 2020/0013971 A1 | 1/2020 | Park | |

FOREIGN PATENT DOCUMENTS

| | | | | |
|---|---|---|---|---|
| CN | 109300913 A | | 2/2019 | |
| CN | 109524572 A | * | 3/2019 | H01L 51/0097 |
| CN | 109524572 A | | 3/2019 | |
| CN | 109546002 A | | 3/2019 | |
| CN | 109616506 A | | 4/2019 | |
| CN | 110491902 A | | 11/2019 | |
| CN | 110504295 A | * | 11/2019 | H01L 27/3223 |
| CN | 110504295 A | | 11/2019 | |
| KR | 20190070424 A | | 6/2019 | |

* cited by examiner

FLEXIBLE DISPLAY PANEL AND MANUFACTURING METHOD THEREOF

FIELD OF INVENTION

The present application relates to the field of display technologies, and in particular, to a flexible display panel and a manufacturing method thereof.

BACKGROUND OF INVENTION

Electronics industry is developing rapidly at present, and as production capacity of conventional flat panel products increases, market is flooded with conventional two-dimensional (2D) flat panel products. Meanwhile, demand for three-dimensional (3D) products and flexible bending products is increasing. In order to meet needs of customers and achieve diversification and convenience of products, currently introduced foldable displays need to have advantages of ultra-thinness and convenience, as well as foldability at various angles. Such foldable displays are used in various fields including multimedia, automotive, and medical equipment.

At present, flexible panel industry has multiple cutting processes for obtaining final display panels. However, in display panels of the conventional art, a laminated film layer at a cutting track position consists of an upper inorganic layer and a lower organic layer. Due to poor ductility of the inorganic layer, fine cracks are easily generated after cutting in a cutting process, and the cracks extend to an interior of the display panels (effective display region) during a bending process, which may damage functional film layers and affect display performance of flexible display panels.

In summary, due to poor ductility of the inorganic layer, cracks are generated after cutting in a cutting process in current flexible display panels and manufacturing method thereof, and the cracks extend to an interior of the display panels during a bending process, which may damage functional film layers and further affect display performance of the flexible display panels.

Technical Problem

In current flexible display panels and the manufacturing method thereof, due to poor ductility of the inorganic layer, cracks are generated after cutting in a cutting process, and the cracks extend to an interior of the display panels during a bending process, which may damage functional film layers and further affect display performance of the flexible display panels.

SUMMARY OF INVENTION

Technical Solutions

The embodiments of the present application provide a flexible display panel and a manufacturing method thereof, under the premise of not increasing mask plate, process flow, and materials, which can solve a technical problem of current flexible display panels that due to poor ductility of the inorganic layer, cracks are generated after cutting in a cutting process, and the cracks extend to an interior of the display panels during a bending process, which may damage functional film layers and further affect display performance of flexible display panels.

In a first aspect, an embodiment of the present application provides a flexible display panel including a display region and a non-display region, wherein a part of the flexible display panel disposed in the non-display region comprises a flexible substrate, a multi-barrier layer, and a planarization layer; and wherein a cutting track is defined at a peripheral edge of the non-display region, and a groove is defined in the cutting track, and an end of the planarization layer extends to at least an interface formed between the multi-barrier layer and the flexible substrate through a sidewall of the groove.

In the flexible display panel according to an embodiment of the present application, the groove is defined in the multi-barrier layer, and the groove penetrates the multi-barrier layer and a part of the flexible substrate.

In the flexible display panel according to an embodiment of the present application, the groove is rectangular, and a width of the groove ranges from 3 um to 25 um.

In the flexible display panel according to an embodiment of the present application, material of the flexible substrate includes polyimide, and material of the planarization layer includes an organic photoresist.

In the flexible display panel according to an embodiment of the present application, the multi-barrier layer is a multilayered of laminated inorganic film layers, and material of each of the inorganic film layers includes one or a combination of alumina, zinc oxide, titanium oxide, silicon dioxide, and zirconia.

In the flexible display panel according to an embodiment of the present application, a thickness of the multi-barrier layer ranges from 1 um to 2 um, and a thickness of the planarization layer ranges from 1 um to 10 um.

In a second aspect, an embodiment of the present application further provides a method of manufacturing a flexible display panel, the flexible display panel including a display region, a non-display region, and a cutting track defined at a peripheral edge of the non-display region, the method including following steps:

S10, forming a multi-barrier layer on a flexible substrate, wherein the cutting track is defined in the multi-barrier layer;

S20, forming a thin film transistor (TFT) array layer on the multi-barrier layer, wherein the TFT array layer is disposed on the display region;

S30, forming a groove on a part of the multi-barrier layer corresponding to a position of the cutting track, wherein the groove penetrates the multi-barrier layer and a part of the flexible substrate; and S40, forming a planarization layer on the multi-barrier layer, wherein the planarization layer completely covers the TFT array layer, and an end of the planarization layer extends to at least an interface formed between the multi-barrier layer and the flexible substrate through a sidewall of the groove.

In the method of manufacturing the flexible display panel according to an embodiment of the present application, in the step S10, the multi-barrier layer is a multilayered of laminated inorganic film layers, and material of each of the inorganic film layers includes one or a combination of alumina, zinc oxide, titanium oxide, silicon dioxide, and zirconia.

In the method of manufacturing the flexible display panel according to an embodiment of the present application, in the step S30, the groove is rectangular, and a width of the groove ranges from 3 um to 25 um.

In the method of manufacturing the flexible display panel according to an embodiment of the present application, material of the flexible substrate is polyimide, material of the multi-barrier layer is silicon dioxide, and material of the planarization layer is an organic photoresist.

Beneficial Effect

Compared with the conventional art, a flexible display panel and a manufacturing method thereof provided in the embodiments of the present application, under the premise of not increasing mask plate and process flow, prevent cracks of the flexible display panel from being generated during a bending process due to poor ductility of an inorganic layer after a cutting process, and further ensure display performance of the flexible display panel.

DETAILED DESCRIPTION OF EMBODIMENTS

The embodiments of the present application are directed to current flexible display panels and a manufacturing method. They have a technical problem that cracks are generated after cutting due to poor ductility of an inorganic layer, and the cracks extend to an interior of display panels during a bending process, which may damage functional film layers and further affect display performance of the flexible display panels. The present embodiment can solve that defect.

Figure 1:
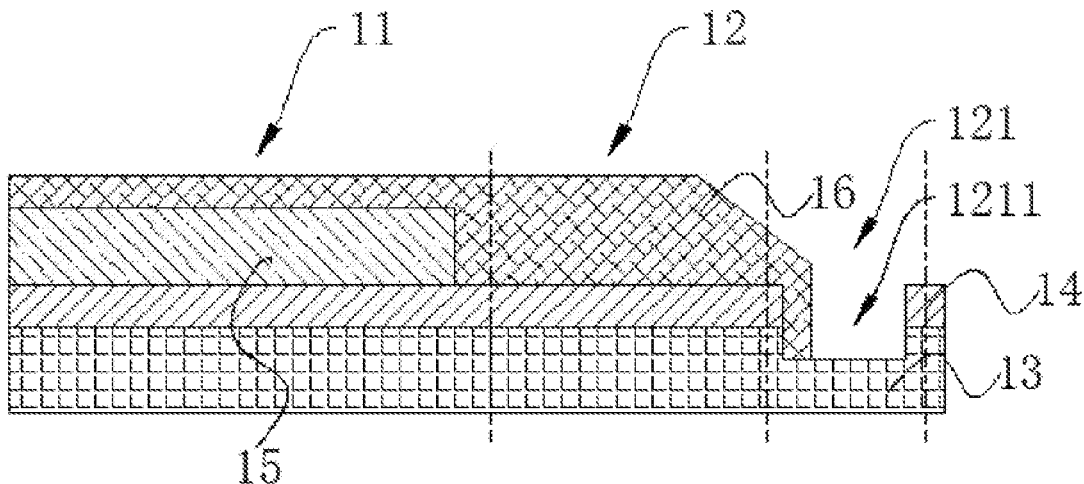
FIG. 1 is a schematic cross-sectional structure diagram of a flexible display panel according to an embodiment of the present application.

Shown in FIG. 1 is a cross-sectional structure diagram of a flexible display panel according to an embodiment of the present application. The flexible display panel includes a display region 11 and a non-display region 12, and a part of the flexible display panel disposed in the display region 11 includes a flexible substrate 13, a multi-barrier layer 14, a thin film transistor (TFT) array layer 15, and a planarization layer 16. A part of the flexible display panel disposed in the non-display region 12 includes the flexible substrate 13, the multi-barrier layer 14, and the planarization layer 16.

Specifically, a cutting track 121 is defined at a peripheral edge of the non-display region 12, a groove 1211 is defined in the cutting track 121, and an end of the planarization layer 16 extends to at least an interface formed between the multi-barrier layer and the flexible substrate through a sidewall of the groove 1211. Preferably, the end of the planarization layer 16 extends to a bottom of the groove 1211 through the sidewall of the groove 1211.

Specifically, the display region 11 is configured to display images, and the non-display region 12 is configured to dispose peripheral circuits of the display region 11.

Specifically, material of the flexible substrate 13 includes polyimide.

Specifically, the multi-barrier layer 14 is multiple layers of laminated inorganic film layers, and material of each of the inorganic film layers includes one or a combination of alumina, zinc oxide, titanium oxide, silicon dioxide, and zirconia. In the embodiment of the present invention, material of the inorganic film layer is preferably silicon dioxide.

Specifically, material of the planarization layer 16 includes an organic photoresist, and the material of the planarization layer 16 can be well combined with the multi-barrier layer.

Specifically, a thickness of the multi-barrier layer ranges from 1 um (micron) to 2 um, and a thickness of the planarization layer ranges from 1 um to 10 um.

In the embodiment of the present application, the groove 1211 is rectangular, and a width of the groove ranges from 3 um to 25 um. The groove 1211 penetrates the multi-barrier layer 14 and a part of the flexible substrate 13. That is, a depth of the groove 1211 is greater than the thickness of the multi-barrier layer, and the depth of the groove 1211 ranges from 1 um to 5 um. Preferably, a distance from a side of the sidewall of the groove 1211 away from the planarization layer 16 to an edge of the flexible substrate is less than 300 um.

Figure 2:
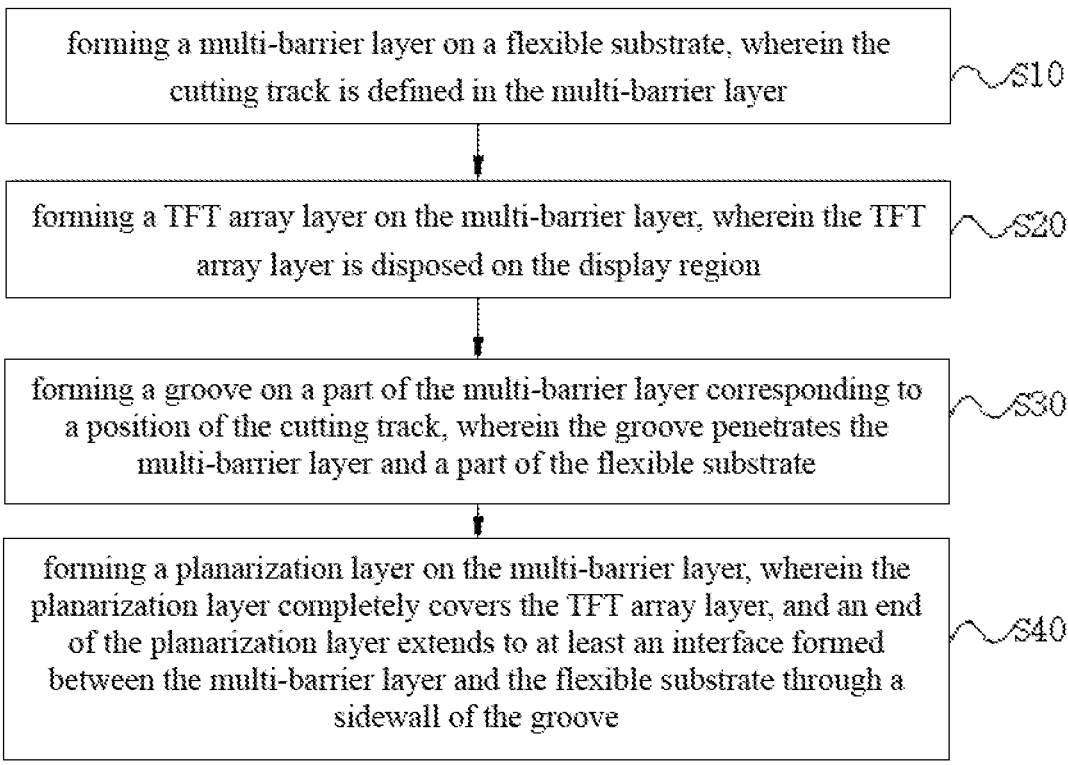
FIG. 2 is a schematic flowchart of a manufacturing method of a flexible display panel according to an embodiment of the present application.

Shown in FIG. 2 is a schematic flowchart of a manufacturing method of a flexible display panel according to an embodiment of the present application. The flexible display panel includes a display region 11 and a non-display region 12. A peripheral edge of the non-display region 12 is defined with a cutting track 121. In a cutting process of the flexible display panel, a cutting blade cuts the flexible display panel along the cutting track 121, and the method includes following steps.

S10, forming a multi-barrier layer 14 on a flexible substrate 13, wherein the cutting track 121 is defined in the multi-barrier layer 14.

Specifically, the step S10 further includes following.

Figure 3A:
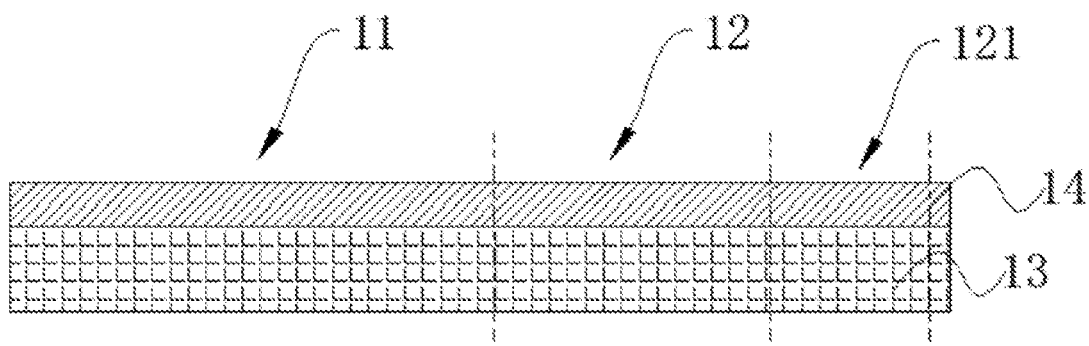
FIGS. 3A to 3D are schematic structural diagrams showing the manufacturing method of the flexible display panel according to an embodiment of the present application.

First, a flexible substrate 13 is provided, and material of the flexible substrate 13 is preferably polyimide. Then, the multi-barrier layer 14 is deposited on the flexible substrate 13 by a chemical vapor deposition (PECVD) process, a plating process, or a sputtering process. The multi-barrier layer 14 is multiple layers of laminated inorganic film layers, and material of each of the inorganic film layers includes one or a combination of alumina, zinc oxide, titanium oxide, silicon dioxide, and zirconia. In the embodiment of the present invention, material of the inorganic film layer is preferably silicon dioxide. Specifically, the cutting track 121 is defined in the multi-barrier layer 14, and a thickness of the multi-barrier layer ranges from 1 um to 2 um, as shown in FIG. 3A.

S20, forming a thin film transistor (TFT) array layer 15 on the multi-barrier layer 14, wherein the TFT array layer 15 is disposed on the display region 11.

Specifically, the step S20 further includes following.

Figure 3B:
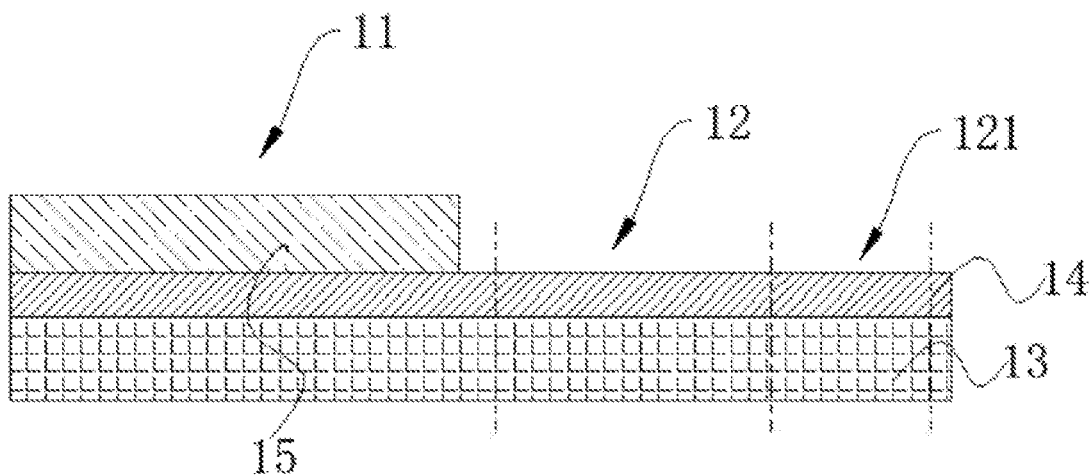

First, the TFT array layer 15 is formed on the multi-barrier layer 14, and the TFT array layer 15 is defined in the display region 11. The TFT array layer 14 includes a gate buffer layer, an active layer, a gate insulation layer, a gate, an interlayer insulation layer, and sources and drains, and the TFT array layer 15 further includes a hole and a channel region. The TFT array layer 15 is configured to drive pixels of the flexible display panel, as shown in FIG. 3B.

S30, forming a groove 1211 on a part of the multi-barrier layer 14 corresponding to a position of the cutting track 121, wherein the groove penetrates the multi-barrier layer 14 and a part of the flexible substrate 13. Specifically, the step S30 further includes following.

Figure 3C:
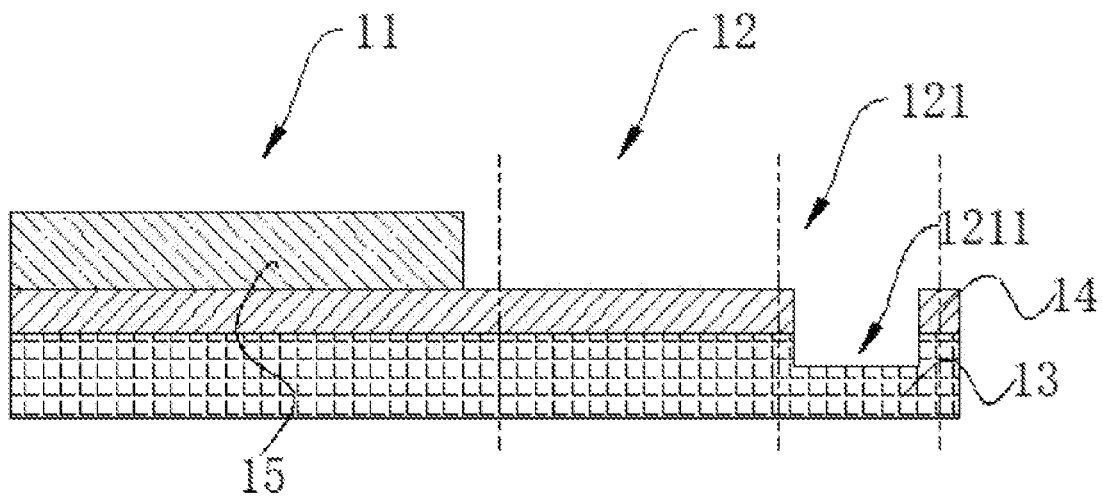

First, a first groove is defined by a CNT process on a part of the multi-barrier layer 14 positioned on the cutting track 121. After the first groove penetrates a part of the multi-barrier layer 14, the groove 1211 is defined on a basis of the first groove by an ISO process or a DH process, and the groove 1211 penetrates the multi-barrier layer 14 and a part of the flexible substrate 13. In the embodiment of the present invention, the groove 1211 is rectangular, a width of the groove ranges from 3 um to 25 um, a depth of the groove 1211 is greater than a thickness of the multi-barrier layer, and the depth of groove 1211 ranges from 1 um to 5 um, as shown in FIG. 3C.

S40, forming a planarization layer 16 on the multi-barrier layer 14, wherein the planarization layer 16 completely covers the TFT array layer 15, and an end of the planarization layer 16 extends to at least an interface formed between the multi-barrier layer 14 and the flexible substrate 13 through a sidewall of the groove 1211.

Figure 3D:
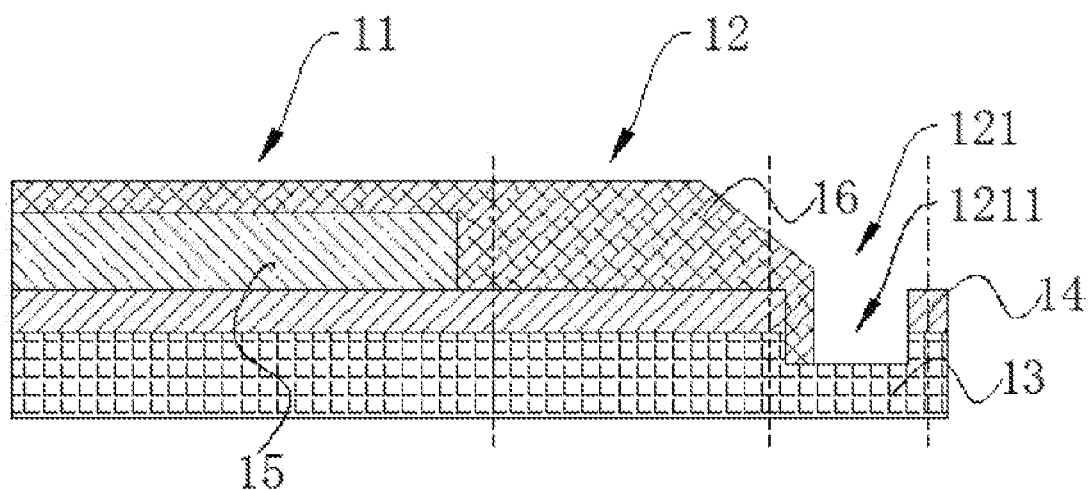

Specifically, the step S40 further includes: first, the planarization layer 16 is deposited on the multi-barrier layer 14 by a chemical vapor deposition process, an evaporation process, or a sputtering process on the flexible substrate, and the planarization layer 16 completely covers the TFT array layer 15. The end of the planarization layer 16 extends from the display region 11 to the non-display region 12, and extends to at least the interface formed between the multi-barrier layer 14 and the flexible substrate 13 through the sidewall of the groove 1211, which enables the interface to be covered by the planarization layer 16, thereby preventing cracks on the interface. Preferably, the end of the planarization layer 16 extends to a bottom of the groove 1211 through the sidewall of the groove 1211. Material of the planarization layer 16 is preferably an organic photoresist. The material of the planarization layer 16 can be well combined with the multi-barrier layer. A thickness of the planarization layer ranges from 1 um to 10 um, as shown in FIG. 3D.

The flexible display panel and the manufacturing method provided in the embodiments of the present application can completely solve the problem of crack occurrence. At the same time, the present technology is not only suitable for crack prevention at a position of the cutting track, but can also be applied to an irregular-shaped hole-defining process or an irregular-shaped product cutting crack prevention process. In addition, thinning of the cutting track is conducive to laser cutting process, which reduces both time and cost.

For specific implementation of the foregoing operations, refer to the foregoing embodiments, and details are not described herein again.

In summary, a flexible display panel and a manufacturing method thereof provided in the embodiments of the present application, under the premise of not increasing mask plate and process flow, prevent cracks of the flexible display panel from being generated during a bending process due to poor ductility of an inorganic layer after a cutting process, and further ensure display performance of the flexible display panel.

It can be understood that for a person of ordinary skill in the art, equivalent replacements or changes can be made according to the technical solution of the present application and its inventive concept, and all these changes or replacements should fall within the protection scope of the claims attached to this application.

What is claimed is:

1. A flexible display panel comprising a display region and a non-display region, wherein a part of the flexible display panel disposed in the non-display region comprises a flexible substrate, a multi-barrier layer, and a planarization layer, and
wherein a thin film transistor (TFT) array layer is formed on the multi-barrier layer and the TFT array layer is disposed on the display region;
wherein a cutting track is defined at a peripheral edge of the non-display region, a groove is defined in the cutting track, and an end of the planarization layer extends to at least an interface formed between the multi-barrier layer and the flexible substrate through a sidewall of the groove; and
wherein layers of the flexible display panel corresponding to a position of the groove defined in the cutting track are free of an inorganic layer; and
wherein the groove is defined in the multi-barrier layer, the groove penetrates the multi-barrier layer and a part of the flexible substrate, the groove exposes a portion of a side surface of the flexible substrate, and the planarization layer covers the portion of the side surface of the flexible substrate; and
wherein a depth of the groove is greater than the thickness of the multi-barrier layer.

2. The flexible display panel according to claim 1, wherein the groove is rectangular, and a width of the groove ranges from 3 um to 25 um.

3. The flexible display panel according to claim 1, wherein material of the flexible substrate comprises polyimide, and material of the planarization layer comprises an organic photoresist.

4. The flexible display panel according to claim 1, wherein the multi-barrier layer is multiple layers of laminated inorganic film layers, and material of each of the inorganic film layers comprises one or a combination of alumina, zinc oxide, titanium oxide, silicon dioxide, and zirconia.

5. The flexible display panel according to claim 1, wherein a thickness of the multi-barrier layer ranges from 1 um to 2 um, and a thickness of the planarization layer ranges from 1 um to 10 um.

6. A method of manufacturing a flexible display panel comprising a display region, a non-display region, and a cutting track defined at a peripheral edge of the non-display region, wherein the method comprises following steps:
S10, forming a multi-barrier layer on a flexible substrate, wherein the cutting track is defined in the multi-barrier layer;
S20, forming a thin film transistor (TFT) array layer on the multi-barrier layer, wherein the TFT array layer is disposed on the display region;
S30, forming a groove on a part of the multi-barrier layer corresponding to a position of the cutting track, wherein the groove penetrates the multi-barrier layer and a part of the flexible substrate, and wherein layers of the flexible display panel corresponding to a position of the groove defined in the cutting track are free of an inorganic layer, and the groove exposes a portion of a side surface of the flexible substrate; and
S40, forming a planarization layer on the multi-barrier layer, wherein the planarization layer completely covers the TFT array layer, and an end of the planarization layer extends to at least an interface formed between the multi-barrier layer and the flexible substrate through a sidewall of the groove, and the planarization layer covers the portion of the side surface of the flexible substrate; and
wherein a depth of the groove is greater than the thickness of the multi-barrier layer.

7. The method of manufacturing the flexible display panel according to claim 6, wherein in the step S10, the multi-barrier layer is multiple layers of laminated inorganic film layers, and material of each of the inorganic film layers comprises one or a combination of alumina, zinc oxide, titanium oxide, silicon dioxide, and zirconia.

8. The method of manufacturing the flexible display panel according to claim 6, wherein in the step S30, the groove is rectangular, and a width of the groove ranges from 3 um to 25 um.

9. The method of manufacturing the flexible display panel according to claim 6, wherein material of the flexible substrate is polyimide, material of the multi-barrier layer is silicon dioxide, and material of the planarization layer is an organic photoresist.

\* \* \* \* \*